(12) United States Patent
Miyoshi

(10) Patent No.: US 10,567,884 B2
(45) Date of Patent: Feb. 18, 2020

(54) ELECTROACOUSTIC TRANSDUCER

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/958,150

(22) Filed: Apr. 20, 2018

(65) Prior Publication Data
US 2018/0242087 A1    Aug. 23, 2018

Related U.S. Application Data

(63) Continuation of application No. PCT/JP2016/080551, filed on Oct. 14, 2016.

(30) Foreign Application Priority Data

Oct. 22, 2015 (JP) ................................. 2015-207827
Nov. 19, 2015 (JP) ................................. 2015-226698
Mar. 28, 2016 (JP) ................................. 2016-064404

(51) Int. Cl.
*H01L 41/053* (2006.01)
*H04R 17/00* (2006.01)
(Continued)

(52) U.S. Cl.
CPC ......... *H04R 17/005* (2013.01); *B06B 1/0603* (2013.01); *B06B 1/0611* (2013.01);
(Continued)

(58) Field of Classification Search
CPC ..... H01L 41/053; H01L 41/193; H04R 17/00; H04R 17/005; H04R 17/025; H04R 17/02;
(Continued)

(56) References Cited

U.S. PATENT DOCUMENTS 5,977,685 A * 11/1999 Kurita ................... C08G 18/10
310/311
6,321,428 B1 * 11/2001 Toda ..................... B06B 1/0688
29/25.35
(Continued)

FOREIGN PATENT DOCUMENTS

JP         52-57493 U     4/1977
JP         55-115799 A    9/1980
(Continued)

OTHER PUBLICATIONS

International Preliminary Report on Patentability, issued in PCT/JP2016/080551, dated Oct. 30, 2017.
(Continued)

*Primary Examiner* — Derek J Rosenau
(74) *Attorney, Agent, or Firm* — Birch, Stewart, Kolasch & Birch, LLP

(57) ABSTRACT

An electroacoustic transduction film including a polymer composite piezoelectric body in which piezoelectric body particles are dispersed in a viscoelastic matrix formed of a polymer material having viscoelasticity at a normal temperature, and thin film electrodes respectively laminated on both surfaces of the polymer composite piezoelectric body is included, and two or more of the electroacoustic transduction films are laminated, and a gap between the adjacent electroacoustic transduction films is less than or equal to 3 cm.

17 Claims, 6 Drawing Sheets

(51) Int. Cl.
*G10K 11/178* (2006.01)
*H04R 3/02* (2006.01)
*G10K 9/125* (2006.01)
*B06B 1/06* (2006.01)
*H01L 41/193* (2006.01)
*H04R 17/02* (2006.01)

(52) U.S. Cl.
CPC ............ *G10K 9/125* (2013.01); *G10K 11/178* (2013.01); *G10K 11/1785* (2018.01); *H01L 41/053* (2013.01); *H01L 41/193* (2013.01); *H04R 3/02* (2013.01); *H04R 17/025* (2013.01); *G10K 2210/3212* (2013.01); *G10K 2210/3226* (2013.01)

(58) Field of Classification Search
CPC ....... B06B 1/06; B06B 1/0603; B06B 1/0611; G10K 11/178
USPC .......................................................... 310/800
See application file for complete search history.

(56) References Cited

U.S. PATENT DOCUMENTS

| | | | |
|---|---|---|---|
| 2014/0049970 A1* | 2/2014 | de Bock | ............ H01L 41/0926 362/373 |
| 2014/0210309 A1 | 7/2014 | Miyoshi | |

FOREIGN PATENT DOCUMENTS

| | | |
|---|---|---|
| JP | 2000-115889 A | 4/2000 |
| JP | 2000-175285 A | 6/2000 |
| JP | 2010-227500 A | 10/2010 |
| JP | 2014-14063 A | 1/2014 |

OTHER PUBLICATIONS international Search Report, issued in PCT/JP2016/080551, dated Jan. 10, 2017.
Written Opinion of the International Searching Authority, issued in PCT/JP2016/030551, dated Jan. 10, 2017.

* cited by examiner

FIG. 1A
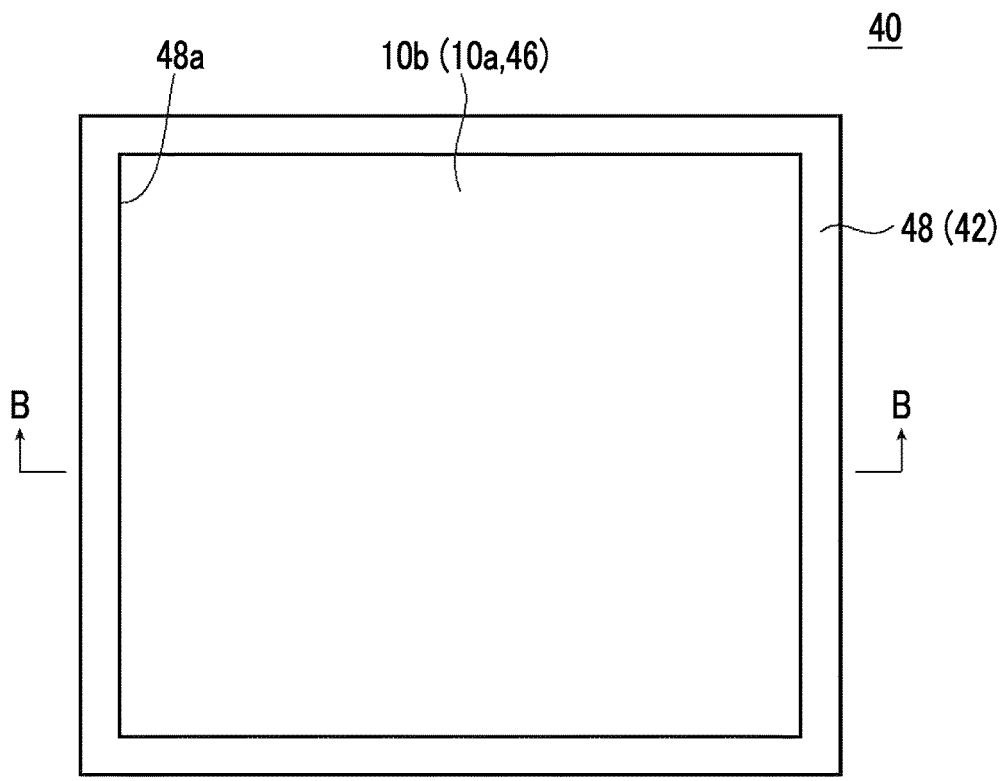
FIG. 1B
FIG. 2
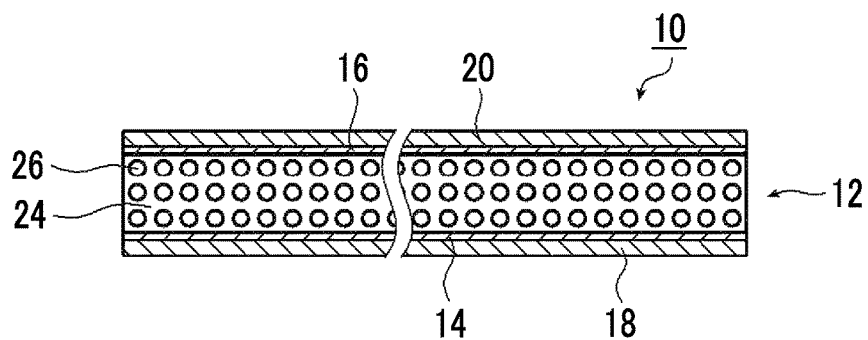

ELECTROACOUSTIC TRANSDUCER

CROSS-REFERENCE TO RELATED APPLICATIONS

This application is a Continuation of PCT International Application No. PCT/JP2016/080551 filed on Oct. 14, 2016, which claims priority under 35 U.S.C. § 119(a) to Japanese Patent Application No. 2015-207827 filed on Oct. 22, 2015, Japanese Patent Application No. 2015-226698 filed on Nov. 19, 2015 and Japanese Patent Application No. 2016-064404 filed on Mar. 28, 2016. Each of the above applications is hereby expressly incorporated by reference, in its entirety, into the present application.

BACKGROUND OF THE INVENTION

1. Field of the Invention

The present invention relates to an electroacoustic transducer having both functions of a microphone and a speaker.

2. Description of the Related Art

In recent years, in the audio field, headphones and earphones with a noise cancelling function of reducing ambient noise for ease of listening to music have been used.

In general, a noise cancelling device is configured to include a microphone which detects ambient noise and a speaker which reproduces a noise cancellation signal with the inverted phase to the noise on the basis of a noise signal detected by the microphone, thereby reproducing sound with the inverted phase to the noise and cancelling the noise.

In such a noise cancelling device, miniaturization using a piezoelectric element as a speaker and a microphone is considered.

For example, JP2010-227500A describes a noise cancellation system which includes a speaker that is formed of a piezoelectric element and outputs sound and a non-magnetic built-in microphone that acquires at least noise inside a closed space to which the speaker outputs sound, in which a noise cancellation device generates a sound signal to cancel the noise inside the closed space by using at least a noise signal acquired by the built-in microphone and outputs the sound signal to the speaker.

In addition, JP2000-175285A describes a device including a speaker and a microphone integrated with each other by using piezoelectric elements as the speaker and the microphone, in which two or more ceramic piezoelectric elements are attached to a single vibration plate, a plurality of contact surfaces are provided in the piezoelectric elements to enable a plurality of inputs and outputs, thereby separately providing functions of a speaker and a microphone.

In addition, JP2000-115889A describes an electroacoustic transducer in which piezoelectric elements having a bimorph structure are used, the piezoelectric element of one surface is used as a speaker, and the piezoelectric element of the other surface is used as a microphone. The bimorph structure is a structure in which the piezoelectric elements are bonded to both surfaces of a metal plate.

JP2014-14063A describes that an electroacoustic transduction film which includes a polymer composite piezoelectric body in which piezoelectric body particles are dispersed in a viscoelastic matrix formed of a polymer material having viscoelasticity at a normal temperature, and thin film electrodes disposed on both surfaces of the polymer composite piezoelectric body is used in a speaker or a microphone.

SUMMARY OF THE INVENTION

A device having functions of a speaker and a microphone can be miniaturized by employing a configuration in which piezoelectric elements are bonded to both surfaces of a single vibration plate (metal plate) and employing a configuration in which one piezoelectric element is used as a microphone and the other piezoelectric element is used as a speaker.

However, in a case where the configuration in which the piezoelectric elements are bonded to both surfaces of the single vibration plate is employed, vibration coupling (crosstalk) occurs via the vibration plate which is a common member. It is considered that the occurrence of crosstalk may be suppressed by sound cutting out, circuit designs, and the like. However, the occurrence of crosstalk cannot be sufficiently suppressed, and there is a problem that howling easily occurs.

An object of the present invention is to solve such a problem of the related art, and is to provide an electroacoustic transducer which includes a speaker and a microphone and is capable of suppressing the occurrence of howling with a simple configuration.

The present inventors have intensively studied to attain the object, and found that by providing an electroacoustic transduction film including a polymer composite piezoelectric body in which piezoelectric body particles are dispersed in a viscoelastic matrix formed of a polymer material having viscoelasticity at a normal temperature, and thin film electrodes respectively laminated on both surfaces of the polymer composite piezoelectric body, laminating two or more of the electroacoustic transduction films, and causing the gap between the adjacent electroacoustic transduction films to be less than or equal to 3 cm, the problem can be solved, thereby completing the present invention.

That is, the present invention provides an electroacoustic transducer having the following configuration.

(1) An electroacoustic transducer comprising: an electroacoustic transduction film including a polymer composite piezoelectric body in which piezoelectric body particles are dispersed in a viscoelastic matrix formed of a polymer material having viscoelasticity at a normal temperature, and thin film electrodes respectively laminated on both surfaces of the polymer composite piezoelectric body, in which two or more of the electroacoustic transduction films are laminated, and a gap between the electroacoustic transduction films adjacent to each other is less than or equal to 3 cm.

(2) The electroacoustic transducer according to (1), in which the electroacoustic transduction films adjacent to each other are in contact with each other.

(3) The electroacoustic transducer according to (1) or (2), in which the electroacoustic transduction film is held such that at least a portion of the electroacoustic transduction film is bent so as to protrude toward one principal surface side.

(4) The electroacoustic transducer according to (3), in which the electroacoustic transduction film is held such that at least a portion of the electroacoustic transduction film is bent in a cross-section in one direction perpendicular to a principal surface and a cross-section in the other direction perpendicular to the one direction.

(5) The electroacoustic transducer according to (3) or (4), in which at least one of the electroacoustic transduction films is bent and supported by an elastic supporter.

(6) The electroacoustic transducer according to (5), in which the elastic supporter has viscoelasticity.

(7) The electroacoustic transducer according to any one of (1) to (6), in which at least one of the electroacoustic transduction films functions as a microphone, and at least another of the electroacoustic transduction films functions as a speaker.

(8) The electroacoustic transducer according to any one of (1) to (7), in which at least one of the electroacoustic transduction films functions as a microphone which detects ambient noise, and at least another of the electroacoustic transduction films functions as a speaker which reproduces a noise cancellation signal generated on the basis of a noise signal detected by the microphone.

(9) The electroacoustic transducer according to any one of (1) to (7), in which at least one of the electroacoustic transduction films functions as a microphone which detects ambient noise, and at least another of the electroacoustic transduction films functions as a speaker which amplifies and reproduces a noise signal detected by the microphone.

(10) The electroacoustic transducer according to (9), in which, in a case where a pressing force is applied from the outside to one principal surface side of the two or more electroacoustic transduction films laminated, howling occurs between the microphone and the speaker to amplify vibration of the speaker.

(11) The electroacoustic transducer according to (9) or (10), in which the ambient noise is low frequency noise at 400 Hz or less.

According to the present invention, it is possible to provide an electroacoustic transducer capable of suppressing the occurrence of howling with a simple configuration.

BRIEF DESCRIPTION OF THE DRAWINGS

FIG. 1A is a top view schematically illustrating an example of an electroacoustic transducer of the present invention.

FIG. 1B is a sectional view taken along line B-B in FIG. 1A.

FIG. 2 is a sectional view schematically illustrating an example of an electroacoustic transduction film.

DESCRIPTION OF THE PREFERRED EMBODIMENTS

Figure 3A:
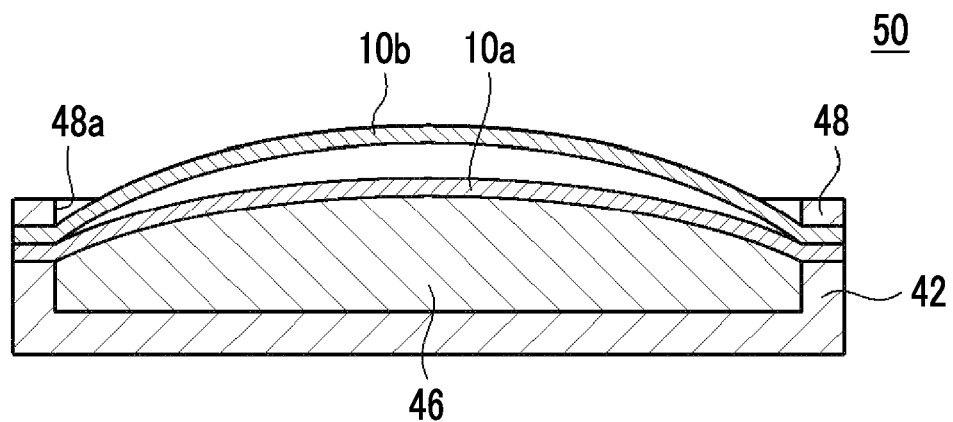
FIG. 3A is a sectional view schematically illustrating another example of the electroacoustic transducer of the present invention.

Hereinafter, an electroacoustic transducer of the present invention will be described in detail based on the suitable embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

The electroacoustic transducer of the present invention includes an electroacoustic transduction film including a polymer composite piezoelectric body in which piezoelectric body particles are dispersed in a viscoelastic matrix formed of a polymer material having viscoelasticity at a normal temperature, and thin film electrodes respectively laminated on both surfaces of the polymer composite piezoelectric body, in which two or more of the electroacoustic transduction films are laminated, and a gap between the adjacent electroacoustic transduction films is less than or equal to 3 cm.

FIG. 1A is a top view schematically illustrating an example of the electroacoustic transducer of the present invention, and FIG. 1B is a sectional view taken along line B-B in FIG. 1A.

An electroacoustic transducer 40 illustrated in FIGS. 1A and 1B includes two electroacoustic transduction films 10a and 10b, a case 42, a viscoelastic supporter 46, and a pressing member 48. The electroacoustic transducer 40 uses the electroacoustic transduction films (hereinafter, also referred to as "transduction film") 10 as vibration plates, uses one transduction film 10a as a microphone, and uses the other transduction film 10b as a speaker.

As illustrated in FIG. 1B, the electroacoustic transducer 40 has a configuration in which the viscoelastic supporter 46 is accommodated in the case 42, the transduction film 10a is disposed to cover the case 42 and the viscoelastic supporter 46, the transduction film 10b is further disposed to be laminated on the transduction film 10a, the end edge portion of the transduction film 10b (the transduction film 10a) is pressed against and fixed to the case 42 by the pressing member 48. The transduction film 10a and the transduction film 10b are bent and supported by the viscoelastic supporter 46.

Since the transduction film 10a and the 10b have the same configuration and are different only in position, in the following description, in a case where there is no need to distinguish between the transduction film 10a and the transduction film 10b, both the members are collectively referred to as the transduction film 10.

In the electroacoustic transducer 40, in a case where the transduction film 10 is stretched in an in-plane direction due to the application of a voltage to the transduction film 10, the transduction film 10 moves upward (in the radial direction of sound) in order to absorb the stretching. Conversely, in a case where the transduction film 10 is contracted in the in-plane direction due to the application of a voltage to the transduction film 10, the transduction film 10 moves downward (toward the case 42) in order to absorb the contraction. The electroacoustic transducer 40 performs a conversion between a vibration (sound) and an electrical signal by the vibrations caused by repetition of stretching and contraction of the transduction film 10.

Accordingly, the electroacoustic transducer 40 is used to reproduce a sound from the vibration in response to the electrical signal by inputting the electrical signal to the transduction film 10, or convert a vibration of the transduction film 10 due to sound into an electrical signal.

The transduction film 10 is a piezoelectric film which has piezoelectricity and has a principal surface that stretches and contracts in response to the state of an electric field. By holding the transduction film 10 in a bent state, the transduction film 10 converts a stretching and contracting movement along a film surface into a vibration in a direction perpendicular to the film surface, thereby converting an electrical signal into a sound.

Here, the transduction film 10 used in the electroacoustic transducer 40 is a transduction film including a polymer composite piezoelectric body in which piezoelectric body particles are dispersed in a viscoelastic matrix formed of a polymer material having viscoelasticity at a normal temperature, and thin film electrodes laminated on both surfaces of the polymer composite piezoelectric body.

FIG. 2 is a sectional view conceptually illustrating an example of the transduction film 10.

As illustrated in FIG. 2, the transduction film 10 has a piezoelectric layer 12 which is a sheet-like material having piezoelectricity, a lower thin film electrode 14 laminated on one surface of the piezoelectric layer 12, a lower protective layer 18 laminated on the lower thin film electrode 14, an upper thin film electrode 16 laminated on the other surface of the piezoelectric layer 12, and an upper protective layer 20 laminated on the upper thin film electrode 16.

In the transduction film 10, the piezoelectric layer 12 is a polymer composite piezoelectric body.

As conceptually illustrated in FIG. 2, the polymer composite piezoelectric body forming the piezoelectric layer 12 is obtained by dispersing piezoelectric body particles 26 in a viscoelastic matrix 24 containing a polymer material having viscoelasticity at a normal temperature. Furthermore, herein, the "normal temperature" indicates a temperature range of approximately 0° C. to 50° C.

Although described later, the piezoelectric layer 12 is preferably subjected to polarization processing.

Here, it is preferable that the polymer composite piezoelectric body (the piezoelectric layer) 12 has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, in a case where the polymer composite piezoelectric body is hard, large bending stress is generated to that extent, and a crack is generated at the interface between the polymer matrix and the piezoelectric body particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy such that a sound is reproduced. Accordingly, in order to increase the transmission efficiency of the vibration energy, the polymer composite piezoelectric body is required to have suitable hardness. In addition, in a case where the frequency properties of the speaker become smooth, the changed amount of the acoustic quality at the time of when the lowest resonance frequency $f_0$ changes according to a change in the curvature also decreases. Accordingly, the loss tangent of the polymer composite piezoelectric body is required to be suitably large.

As described above, the polymer composite piezoelectric body used in the speaker having flexibility is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time of when the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, in a case where a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 24 using such a polymer material having viscoelasticity at a normal temperature, as necessary, may use a plurality of polymer materials in combination.

That is, in order to adjust dielectric properties or mechanical properties, other dielectric polymer materials may be added to the viscoelastic matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the viscoelastic matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the viscoelastic matrix 24 of the piezoelectric layer 12, the added amount at the time of adding a polymer in addition to the viscoelastic material such as cyanoethylated PVA is not particularly limited, and it is preferable that a ratio of the added polymer to the viscoelastic matrix 24 is less than or equal to 30 vol %.

Accordingly, it is possible to exhibit properties of the polymer material to be added without impairing the viscoelasticity relieving mechanism of the viscoelastic matrix 24, and thus a preferred result is able to be obtained from a viewpoint of increasing a dielectric constant, of improving heat resistance, and of improving adhesiveness between the piezoelectric body particles 26 and the electrode layer.

In addition, for the purpose of increasing the dielectric constant of the piezoelectric layer 12, dielectric particles may be added to the viscoelastic matrix.

The dielectric particles are formed of particles having a relative permittivity as high as 80 or more at 25° C.

As the dielectric particles, lead zirconate titanate (PZT), barium titanate ($BaTiO_3$), titanium oxide ($TiO_2$), strontium titanate ($SrTiO_3$), lead lanthanum zirconate titanate (PLZT), zinc oxide (ZnO), a solid solution (BFBT) of barium titanate and bismuth ferrite ($BiFeO_3$), and the like are exemplified. Among them, it is preferable to use barium titanate ($BaTiO_3$) as the dielectric particles from a viewpoint of having a high relative permittivity.

It is preferable that the average particle diameter of the dielectric particles is less than or equal to 0.5 μm.

In addition, the volume fraction of the dielectric particles with respect to the total volume of the viscoelastic matrix and the dielectric particles is preferably 5% to 45%, more preferably 10% to 30%, and particularly preferably 20% to 30%.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

Furthermore, only one type of these ceramics particles may be used, or a plurality of types thereof may be used in combination.

The particle diameter of the piezoelectric body particles 26 may be appropriately selected according to the size or usage of the transduction film 10, and is preferably 1 μm to 10 μm according to the consideration of the present inventors.

By setting the particle diameter of the piezoelectric body particles 26 to be in the range described above, a preferred result is able to be obtained from a viewpoint of making high piezoelectric properties and flexibility compatible.

In addition, in FIG. 2, the piezoelectric body particles 26 in the piezoelectric layer 12 are uniformly dispersed in the viscoelastic matrix 24 with regularity. However, the present invention is not limited thereto.

That is, in the viscoelastic matrix 24, the piezoelectric body particles 26 in the piezoelectric layer 12 are preferably uniformly dispersed, and may also be irregularly dispersed.

In the transduction film 10, a quantitative ratio of the viscoelastic matrix 24 and the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the viscoelastic matrix 24 and the piezoelectric body particles 26 to be in the range described above, it is possible to obtain a preferred result from a viewpoint of making high piezoelectric properties and flexibility compatible.

In addition, in the transduction film 10, the thickness of the piezoelectric layer 12 is also not particularly limited, and may be appropriately set according to the size of the transduction film 10, the usage of the transduction film 10, properties required for the transduction film 10, and the like.

Here, according to the consideration of the present inventors, by reducing the thickness of the piezoelectric layer 12, the degree of bending due to its own weight can be reduced, and by reducing the weight, the followability of the piezoelectric film to the applied voltage is improved, thereby improving the sound pressure or acoustic quality. In addition, flexibility can be imparted thereto. On the other hand, if the piezoelectric layer 12 is too thin, in a case where a voltage is continuously applied or a high voltage is applied, a local short-circuit may occur regarding rigidity. Furthermore, the rigidity may decrease.

From the above viewpoint, the thickness of the piezoelectric layer 12 is preferably 5 μm to 100 μm, more preferably 8 μm to 50 μm, even more particularly preferably 10 μm to 40 μm, and particularly preferably 15 μm to 25 μm.

Furthermore, as described above, it is preferable that the piezoelectric layer 12 is subjected to polarization processing (poling). The polarization processing will be described below in detail.

As illustrated in FIG. 2, the transduction film 10 has a configuration in which the lower thin film electrode 14 is formed on one surface of the piezoelectric layer 12, the lower protective layer 18 is formed thereon, the upper thin film electrode 16 is formed on the other surface of the piezoelectric layer 12, and the upper protective layer 20 is formed thereon. Here, the upper thin film electrode 16 and the lower thin film electrode 14 form an electrode pair.

In addition to these layers, the transduction film 10 may further include, for example, an electrode lead-out portion that leads out the electrodes from the upper thin film electrode 16 and the lower thin film electrode 14, and an insulating layer which covers a region where the piezoelectric layer 12 is exposed for preventing a short circuit or the like.

As the electrode lead-out portion, the thin film electrode and the protective layer are provided with parts protruding in a convex shape on the outside in the surface direction of the piezoelectric layer. Alternatively, the electrode lead-out portion may be provided by forming a hole by removing a portion of the protective layer, inserting a conductive material such as a silver paste into the hole, and electrically connecting the conductive material and the thin film electrode.

In each of the thin film electrodes, the number of electrode lead-out portions is not limited to one, and two or more electrode lead-out portions may be included. Particularly, in a case of the configuration in which the electrode lead-out portion is provided by removing a portion of the protective layer and inserting the conductive material into the hole, three or more electrode lead-out portions are provided to ensure more reliable electrical connection.

The transduction film 10 has a configuration in which both surfaces of the piezoelectric layer 12 are interposed between the electrode pair, that is, the upper thin film electrode 16 and the lower thin film electrode 14 and the laminated body is further interposed between the upper protective layer 20 and the lower protective layer 18.

The region interposed between the upper thin film electrode 16 and the lower thin film electrode 14 as described above is driven according to an applied voltage.

In the transduction film 10, the upper protective layer 20 and the lower protective layer 18 have a function of covering the upper thin film electrode 16 and the lower thin film electrode 14 and applying appropriate rigidity and mechanical strength to the piezoelectric layer 12. That is, there may be a case where, in the transduction film 10 of the present invention, the piezoelectric layer 12 formed of the viscoelastic matrix 24 and the piezoelectric body particles 26 exhibits extremely superior flexibility under bending deformation at a slow vibration but has insufficient rigidity or mechanical strength depending on the usage. As a compensation for this, the transduction film 10 is provided with the upper protective layer 20 and the lower protective layer 18.

In addition, since the lower protective layer 18 and the upper protective layer 20 are different from each other only in position and have the same configuration, in the following description, in a case where there is no need to distinguish between the lower protective layer 18 and the upper protective layer 20, both the members are collectively referred to as a protective layer.

The upper protective layer 20 and the lower protective layer 18 are not particularly limited, and may use various sheet-like materials. As an example, various resin films are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyamide (PA), polyethylene naphthalate (PEN), triacetylcellulose (TAC), and a cyclic olefin-based resin are suitably used.

Among them, polyamide, polyimide, polyetherimide, polycarbonate, and triacetylcellulose are suitably used from a viewpoint of exhibiting excellent heat resistance by causing the glass transition temperature Tg to be 150° C. or higher. From these, damage to the appearance due to heat generated at the time of applying a voltage is able to be prevented, and it is possible to withstand a shelf test and a driving test at a high temperature.

The thicknesses of the upper protective layer 20 and the lower protective layer 18 are not particularly limited. In addition, the thicknesses of the upper protective layer 20 and the lower protective layer 18 may basically be identical to each other or different from each other.

Here, in a case where the rigidity of the upper protective layer 20 and the lower protective layer 18 excessively increases, not only is the stretching and contracting of the piezoelectric layer 12 constrained, but also the flexibility is impaired, and thus it is advantageous in a case where the thicknesses of the upper protective layer 20 and the lower protective layer 18 become thinner unless mechanical strength or excellent handling ability as a sheet-like material is required.

According to the consideration of the present inventors, in a case where the thickness of each of the upper protective layer 20 and the lower protective layer 18 is less than or equal to twice the thickness of the piezoelectric layer 12, it is possible to obtain a preferred result from a viewpoint of compatibility between ensuring the rigidity and appropriate flexibility, or the like.

For example, in a case where the thickness of the piezoelectric layer 12 is 20 μm and the upper protective layer 20 and the lower protective layer 18 are formed of PET, the thickness of each of the upper protective layer 20 and the lower protective layer 18 is preferably less than or equal to 40 μm, more preferably less than or equal to 20 μm, and particularly preferably less than or equal to 15 μm.

In the transduction film 10, the upper thin film electrode (hereinafter, also referred to as an upper electrode) 16 is formed between the piezoelectric layer 12 and the upper protective layer 20, and the lower thin film electrode (hereinafter, also referred to as a lower electrode) 14 is formed between the piezoelectric layer 12 and the lower protective layer 18.

The upper electrode 16 and the lower electrode 14 are provided to apply an electric field to the transduction film 10 (the piezoelectric layer 12).

In addition, since the lower electrode 14 and the upper electrode 16 are different from each other only in size and position and have the same configuration, in the following description, in a case where there is no need to distinguish between the lower electrode 14 and the upper electrode 16, both the members are collectively referred to as a thin film electrode.

In the present invention, a forming material of the upper electrode 16 and the lower electrode 14 is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, PEDOT/PPS (polyethylenedioxythiophene polystyrene sulfonate), and the like are exemplified. Among them, any one of copper, aluminum, gold, silver, platinum, and indium-tin oxide is suitably exemplified.

In addition, a forming method of the upper electrode 16 and the lower electrode 14 is not particularly limited, and as the forming method, various known methods such as a vapor-phase deposition method (a vacuum film forming method) such as vacuum vapor deposition or sputtering, film formation using plating, a method of adhering a foil formed of the materials described above, and a coating method, are able to be used.

Among them, in particular, by the reason that the flexibility of the transduction film 10 is able to be ensured, a copper or aluminum thin film formed by using the vacuum vapor deposition is suitably used as the upper electrode 16 and the lower electrode 14. Among them, in particular, the copper thin film formed by using the vacuum vapor deposition is suitably used.

The thicknesses of the upper electrode 16 and the lower electrode 14 are not particularly limited. In addition, the thicknesses of the upper electrode 16 and the lower electrode 14 may basically be identical to each other or different from each other.

Here, like the upper protective layer 20 and the lower protective layer 18 described above, in a case where the rigidity of the upper electrode 16 and the lower electrode 14 excessively increases, not only is stretching and contracting of the piezoelectric layer 12 constrained, but also flexibility is impaired. For this reason, in a case where the upper electrode 16 and the lower electrode 14 are in a range where electrical resistance does not excessively increase, it is advantageous in a case where the thickness becomes thinner.

In addition, according to the consideration of the present inventors, in a case where the product of the thicknesses of the upper electrode 16 and the lower electrode 14 and the Young's modulus is less than the product of the thicknesses of the upper protective layer 20 and the lower protective layer 18 and the Young's modulus, the flexibility is not considerably impaired, which is suitable.

For example, in a case of a combination of the upper protective layer 20 and the lower protective layer 18 formed of PET (Young's modulus: approximately 6.2 GPa) and the upper electrode 16 and the lower electrode 14 formed of copper (Young's modulus: approximately 130 GPa), in a case where the thickness of the upper protective layer 20 and the lower protective layer 18 are 25 μm, the thickness of the upper electrode 16 and the lower electrode 14 are preferably less than or equal to 1.2 μm, more preferably less than or equal to 0.3 μm, and particularly preferably less than or equal to 0.1 μm.

In addition, the thin film electrodes are not necessarily formed to correspond to the entire surface of the piezoelectric layer 12 (the lower protective layer 18 and/or the upper protective layer 20).

That is, at least one of the thin film electrodes may be configured to be smaller than, for example, the piezoelectric layer 12, and the piezoelectric layer 12 and the protective layer may be configured to be in direct contact with each other in the peripheral portion of the transduction film 10.

Alternatively, the protective layers where the thin film electrodes are formed on the entire surfaces are not necessarily formed to correspond to the entire surface of the piezoelectric layer 12. In this case, a second protective layer which comes into direct contact with the piezoelectric layer 12 may be configured to be separately provided on the surface side of the protective layer.

Furthermore, a coating layer may be further provided for the purpose of improving the adhesion between the thin film electrode and the piezoelectric layer 12, improving flexibility, and the like. In this case, the coating layer may be applied either onto the thin film electrode or onto the piezoelectric layer 12.

In this case, as a polymer component, thermoplastic resins such as polymethacrylate, polyurethane, a polyester polyolefin, PVA, and polystyrene, and thermosetting resins such as a phenol resin and a melamine resin can be used. Among them, a dielectric polymer is preferably used in order to improve the acoustic performance. Specifically, the above-mentioned polymers and the like can be preferably used. Besides the polymer component, high dielectric particles, an antistatic agent, a surfactant, a thickener, a crosslinking agent, and the like may be added.

In addition, in the illustrated example, the layer configuration of the transduction film 10 includes the piezoelectric layer 12, the lower thin film electrode 14 laminated on one surface of the piezoelectric layer 12, the lower protective layer 18 laminated on the lower thin film electrode 14, the upper thin film electrode 16 laminated on the other surface of the piezoelectric layer 12, and the upper protective layer 20 laminated on the upper thin film electrode 16, but is not limited thereto. In addition to these layers, the layer configuration of the transduction film 10 may further include, for example, an insulating layer which covers a region where the piezoelectric layer 12 is exposed for preventing a short circuit or the like, a colored layer which covers the thin film electrode, and the like.

For example, the layer configuration in a case of having the colored layer may be a configuration having the piezoelectric layer 12, the lower thin film electrode 14 laminated on one surface of the piezoelectric layer 12, a lower colored layer laminated on the lower thin film electrode 14, the lower protective layer 18 laminated on the lower colored layer, the upper thin film electrode 16 laminated on the other surface of the piezoelectric layer 12, an upper colored layer laminated on the upper thin film electrode 16, and the upper protective layer 20 laminated on the upper colored layer.

By providing the colored layers, rusting of the upper thin film electrode 16 and the lower thin film electrode 14 is not allowed to be visible from the outside.

From a viewpoint of not allowing rusting of the thin film electrodes to be visible from the outside, the transmission density of the colored layer is preferably more than or equal to 0.3, and more preferably more than or equal to 0.5.

The transmission density is an optical density measured as a ratio of transmitted light to incoming rays. The transmittance at a transmission density of 0.3 is about 50%, and the transmittance at a transmission density of 0.5 is about 30%.

The thickness of the colored layer is preferably less than or equal to 1 μm, more preferably less than or equal to 100 nm, and particularly preferably less than or equal to 40 nm.

The electrical resistivity of the colored layer is preferably low, and is preferably less than or equal to $1 \times 10^{-7}$ Ωm.

A forming material of the colored layer is not particularly limited as long as the forming material satisfies the transmission density and is not discolored by rusting or the like.

Specifically, as the forming material of the colored layer, metals such as indium, nickel, titanium, aluminum, gold, platinum, and chromium, inorganic pigments such as carbon black (CB), titanium oxide, zinc oxide, barium sulfate, organic pigments based on quinacridone, azo, benzimidazolone, phthalocyanine, and anthraquinone, a member having pores therein and having light scattering properties, and the like are exemplified.

From a viewpoint of the transmission density, the thickness, and the electrical resistivity, metals are preferably used as the forming material of the colored layer, and among them, nickel is more preferable.

In addition, a forming method of the colored layer is not particularly limited, and the colored layer may be formed in various known methods depending on the materials.

For example, in a case of using metals as the forming material of the colored layer, a vapor-phase deposition method (a vacuum film forming method) such as vacuum vapor deposition or sputtering, film formation using plating, a method of adhering a foil formed of the materials described above, and the like are able to be used. It is preferable to form the colored layer using vacuum vapor deposition from a viewpoint of forming the colored layer to be thinner.

In the case of using the pigments as the forming material of the colored layer, an application method, printing, and the like are able to be used.

In addition, a method of transferring the colored layer formed in advance is also able to be used.

The colored layer is not limited to the configuration in which the colored layers are respectively provided on the upper electrode 16 side and the lower electrode 14 side, and a configuration in which the colored layer is provided on at least one side may be provided.

As described above, the transduction film 10 has a configuration in which the piezoelectric layer 12 in which the piezoelectric body particles 26 are dispersed in the viscoelastic matrix 24 containing the polymer material having viscoelasticity at a normal temperature is interposed between the upper electrode 16 and the lower electrode 14 and the laminated body is interposed between the upper protective layer 20 and the lower protective layer 18.

In the transduction film 10, it is preferable that the local maximum value in which the loss tangent (Tan δ) at a frequency of 1 Hz according to the dynamic viscoelasticity measurement is greater than or equal to 0.1 exists at a normal temperature.

Accordingly, even in a case where the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time of when the lowest resonance frequency $f_0$ is changed according to the change in the curvature of the speaker.

The case 42 is a holding member that holds the transduction films 10a and 10b and the viscoelastic supporter 46 together with the pressing member 48. The case 42 is a box-shaped case which is formed of plastic, metal, wood, or the like and has an open surface. In the illustrated example, the case 42 has a thin hexahedral shape, and one of the largest surfaces is the open surface. The open portion has a regular quadrilateral shape. The case 42 accommodates the viscoelastic supporter 46 therein.

In the electroacoustic transducer, the shape of the case 42 (that is, the shape of the electroacoustic transducer) is not limited to the square tubular shape, and a case having various shapes such as a cylindrical shape and a rectangular tubular shape having a rectangular bottom surface is able to be used.

The viscoelastic supporter 46 has moderate viscosity and elasticity, holds the transduction film 10 in a bent state, and imparts a constant mechanical bias at any place of the transduction film 10 to efficiently convert the stretching and contracting movement of the transduction film 10 into a forward and rearward movement (a movement in the direction perpendicular to the surface of the transduction film).

In the illustrated example, the viscoelastic supporter 46 has a quadrangular prism shape having a bottom surface shape substantially equal to the bottom surface of the case 42. In addition, the height of the viscoelastic supporter 46 is larger than the depth of the case 42.

The material of the viscoelastic supporter 46 is not particularly limited as long as the material has moderate viscosity and elasticity and suitably deforms without impeding the vibration of the piezoelectric film. As an example, wool felt, nonwoven fabric of wool felt including rayon or PET, a foamed material (foamed plastic) such as glass wool or polyurethane, polyester wool, a laminate of a plurality of sheets of paper, a magnetic fluid, a coating material, and the like are exemplified.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 kg/m$^3$, and more preferably 100 to 300 kg/m$^3$. In a case where glass wool is used as the viscoelastic supporter, the specific gravity thereof is preferably 10 to 100 kg/m$^3$.

The pressing member 48 is for supporting the transduction film 10 in a state of being pressed against the viscoelastic supporter 46, and is a member formed of plastic, metal, wood, or the like in a regular quadrilateral shape with an opening 48a at the center. The pressing member 48 has the same shape as the open surface of the case 42, and the shape of the opening 48a is the same regular quadrilateral shape as the open portion of the case 42.

The electroacoustic transducer 40 is configured by accommodating the viscoelastic supporter 46 in the case 42, covering the case 42 and the viscoelastic supporter 46 with the transduction film 10a, further disposing the transduction film 10b to be laminated on the transduction film 10a, and fixing the pressing member 48 to the case 42 in a state in which the end edge portions of the transduction film 10a and the transduction film 10b are brought into contact with the open surface of the case 42 by the pressing member 48.

A method of fixing the pressing member 48 to the case 42 is not particularly limited, and various known methods such as a method using screws or bolts and nuts and a method using a holding device are able to be used.

In the electroacoustic transducer 40, the height (thickness) of the viscoelastic supporter 46 is greater than the height of the inner surface of the case 42. That is, in a state before the transduction films 10a and 10b and the pressing member 48 are fixed, the viscoelastic supporter 46 is in a state protruding from the upper surface of the case 42.

Therefore, in the electroacoustic transducer 40, the viscoelastic supporter 46 is held in a state in which the viscoelastic supporter 46 is pressed downward by the transduction film 10a and decreases in thickness toward the peripheral portion of the viscoelastic supporter 46. That is, at least a portion of the principal surface of each of the transduction films 10a and 10b is held in a bent state. Accordingly, a bent portion is formed in at least a portion of the transduction films 10a and 10b. In the electroacoustic transducer 40, the bent portion serves as a vibration portion.

At this time, it is preferable that the entire surface of the viscoelastic supporter 46 is pressed in the surface direction of the transduction film 10 so that the thickness decreases over the entire surface. That is, it is preferable that the entire surface of the transduction film 10 is pressed and supported by the viscoelastic supporter 46.

In addition, it is preferable that the bent portion formed in this way gradually changes in curvature from the center to the peripheral portion. Accordingly, the resonance frequencies are distributed, resulting in a wider band.

In addition, in the electroacoustic transducer 40, the viscoelastic supporter 46 is in a state of being compressed more in the thickness direction as it approaches the pressing member 48. However, due to the static viscoelastic effect (stress relaxation), a constant mechanical bias can be maintained at any place of the transduction films 10 and 10b. Accordingly, the stretching and contracting movement of the transduction films 10a and 10b is efficiently converted into a forward and rearward movement, so that it is possible to obtain a flat electroacoustic transducer 40 that is thin, achieves a sufficient sound volume, and has excellent acoustic properties.

In the electroacoustic transducer 40 having such a configuration, a region of each of the transduction films 10a and 10b corresponding to the opening of the pressing member 48 serves as a region that actually vibrates. That is, the pressing member 48 is a portion that defines the vibration region. Therefore, in the electroacoustic transducer 40 illustrated in FIG. 1B, each of the transduction films 10a and 10b has a single vibration portion.

In an electroacoustic transducer which uses a transduction film having piezoelectricity, it is easy to increase the relative size of a vibration plate to the entire unit compared to a cone speaker generally having a circular vibration plate, and miniaturization is facilitated.

Furthermore, it is preferable that the surface of the electroacoustic transducer 40 on the transduction film 10 side and the bent portion are similar. That is, it is preferable that the outer shape of the pressing member 48 and the shape of the opening 48a are similar.

In addition, in the electroacoustic transducer 40, the pressing force of the viscoelastic supporter 46 against the transduction film 10a is not particularly limited, and is 0.005 MPa to 1.0 MPa and particularly preferably about 0.02 MPa to 0.2 MPa in terms of surface pressure at a position where the surface pressure is low.

Moreover, although the thickness of the viscoelastic supporter 46 is not particularly limited, the thickness thereof before being pressed is 1 mm to 100 mm, and particularly preferably 10 mm to 50 mm.

In the illustrated example, the configuration in which the viscoelastic supporter 46 having viscoelasticity is used is provided, but is not limited thereto, and a configuration using an elastic supporter having at least elasticity may be provided.

For example, a configuration including an elastic supporter having elasticity instead of the viscoelastic supporter 46 may be provided.

As the elastic supporter, natural rubber and various synthetic rubbers are exemplified.

As described above, the electroacoustic transducer 40 has a configuration in which the viscoelastic supporter 46 is accommodated in the case 42, the transduction film 10a is disposed to cover the case 42 and the viscoelastic supporter 46, the transduction film 10b is further disposed to be laminated on the transduction film 10a, and the end edge portions of the transduction film 10b (the transduction film 10a) is pressed against and fixed to the case 42 by the pressing member 48.

In addition, the bent portion of the transduction film 10a and the bent portion of the transduction film 10b are in contact with each other and can vibrate independent of each other without being adhered to each other. Among the two transduction films 10a and 10b, one transduction film 10a is used as a microphone, and the other transduction film 10b is used as a speaker.

In the electroacoustic transducer 40 of the present invention, the transduction film 10 obtained by interposing the polymer composite piezoelectric body in which the piezoelectric body particles are dispersed in the viscoelastic matrix formed of the polymer material having viscoelasticity at a normal temperature with the thin film electrodes is used as a vibration plate.

As described above, in the related art, as a device having functions of a speaker and a microphone, a configuration is employed in which piezoelectric elements are bonded to both surfaces of a single vibration plate (metal plate), one piezoelectric element is used as a microphone, and the other piezoelectric element is used as a speaker.

However, in a case where the configuration in which the piezoelectric elements are bonded to both surfaces of the single vibration plate is employed, vibration coupling (crosstalk) occurs via the vibration plate which is a common member. It is considered that the occurrence of crosstalk may be suppressed by sound cutting out, circuit designs, and the like. However, the occurrence of crosstalk cannot be sufficiently suppressed, and there is a problem that howling easily occurs.

Contrary to this, in the electroacoustic transducer of the present invention, the transduction film 10 obtained by interposing the polymer composite piezoelectric body in which the piezoelectric body particles are dispersed in the viscoelastic matrix formed of the polymer material having viscoelasticity at a normal temperature with the thin film electrodes is used as the vibration plate. In the transduction film 10, the internal loss (loss tangent Tan δ) is large at a frequency of about 0 Hz, and the storage elastic modulus E' is small, resulting in a decrease in the speed of sound. Therefore, even in a case where a configuration in which the two transduction films 10 are laminated with a gap of 3 cm therebetween is employed, vibration transmitted from one transduction film to the other transduction film can be canceled out, and thus the propagation of the vibration from one transduction film to the other transduction film can be prevented. Therefore, the occurrence of crosstalk can be suppressed, and the occurrence of howling can be suppressed with a simple configuration.

In addition, the electroacoustic transducer of the present invention can be used as a noise cancelling device by using at least one transduction film as a microphone which detects ambient noise, using at least one of the other transduction films as a speaker which reproduces a noise cancellation signal generated on the basis of a noise signal detected by the microphone.

Here, in the electroacoustic transducer of the present invention, since it is possible to dispose the transduction film that functions as the microphone and the transduction film that functions as the speaker to be close to each other without causing a problem such as crosstalk, there is no need to consider the relative position between the microphone and the speaker in a case where a noise cancellation signal is generated on the basis of a noise signal detected by the microphone, so that an increase in arithmetic processing speed and miniaturization of the device can be achieved.

Here, in the electroacoustic transducer 40 illustrated in FIG. 1B, the transduction film 10a and the transduction film 10b are laminated so as to be in contact with each other. However, the transduction film 10a and the transduction film 10b are not limited thereto and may be provided with a gap therebetween.

Figure 3B:
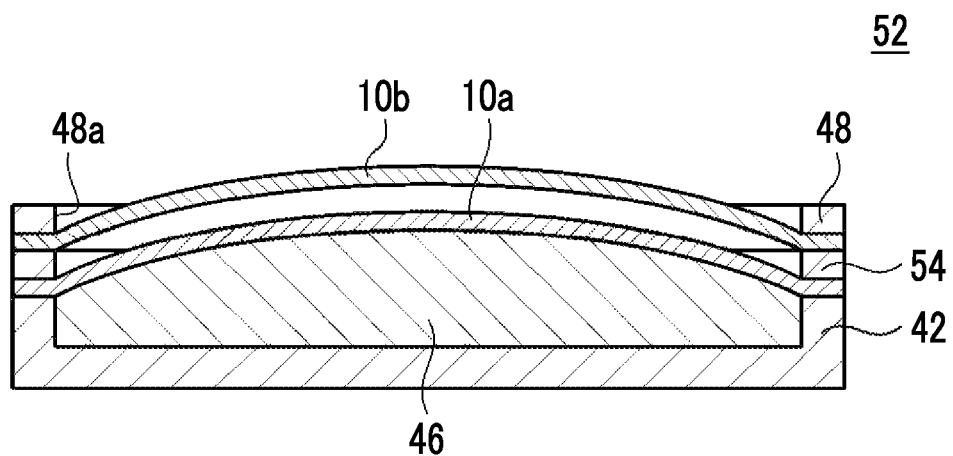
FIG. 3B is a sectional view schematically illustrating another example of the electroacoustic transducer of the present invention.

An example of the electroacoustic transducer in which a gap is provided between the transduction film 10a and the transduction film 10b is illustrated in each of FIGS. 3A and 3B.

Since an electroacoustic transducer 50 illustrated in FIG. 3A has the same configuration as the electroacoustic transducer 40 illustrated in FIG. 1B except that the shape of the transduction film 10b is changed, like parts are denoted by like reference numerals, and different parts are mainly described in the following description.

Similarly, since an electroacoustic transducer 52 illustrated in FIG. 3B has the same configuration as the electroacoustic transducer 40 illustrated in FIG. 1B except that a spacer 54 is provided between the transduction film 10a and the transduction film 10b, like parts are denoted by like reference numerals, and different parts are mainly described in the following description.

In the electroacoustic transducer 50 illustrated in FIG. 3A, a region of the transduction film 10b disposed on the surface side corresponding to the opening 48a of the pressing member 48 is formed in a convex shape so as to protrude toward one principal surface side.

As illustrated in the figure, the amount of curvature of the convex portion of the transduction film 10b is larger than the amount of curvature of the transduction film 10a disposed on the viscoelastic supporter 46 side. Therefore, a gap is formed between the bent portion of the transduction film 10a and the bent portion (convex portion) of the transduction film 10b. Here, in the present invention, the largest gap between the transduction film 10a and the transduction film 10b is more than or equal to 3 cm.

In a case where a convex portion is formed and bent in the transduction film 10 itself, a forming method of the convex portion is not particularly limited, and various known resin film processing methods can be used. For example, the convex portion can be formed by forming methods such as a vacuum pressure molding method or embossing.

The electroacoustic transducer 52 illustrated in FIG. 3B has a spacer 54 between the transduction film 10a and the transduction film 10b to provide a gap between the transduction film 10a and the transduction film 10b.

The spacer 54 is a square-shaped plate member having the same shape as the pressing member 48 and having an opening at the center.

The spacer 54 is disposed to press the end edge portion of the transduction film 10a disposed to cover the case 42 and the viscoelastic supporter 46, the transduction film 10b is disposed on the spacer 54, the pressing member 48 is disposed to press the end edge portion of the transduction film 10b, and the spacer 54 and the pressing member 48 are configured to be fixed to the case 42.

Similar to the transduction film 10b of the electroacoustic transducer 50 illustrated in FIG. 3A, a region of the transduction film 10b corresponding to the opening 48a of the pressing member 48 is formed in a convex shape so as to protrude toward one principal surface side.

Accordingly, a gap is formed between the bent portion of the transduction film 10a and the bent portion (convex portion) of the transduction film 10b.

In addition, in the electroacoustic transducer 40 illustrated in FIG. 1B, the entire region of the peripheral edge portions of the transduction films 10a and 10b is pressed against the case 42 by the pressing member 48, but the present invention is not limited thereto.

That is, the electroacoustic transducer using the transduction film 10 is also able to use a configuration in which the transduction film 10 is pressed against and fixed to the upper surface of the case 42 by screws, bolts and nuts, holding devices, or the like, for example, at the four corners of the case 42 without using the pressing member 48.

Furthermore, for example, in a case of a configuration in which the entire region of the peripheral edge portion of the transduction film 10 is pressed by the pressing member 48, the electroacoustic transduction film is held such that at least a portion thereof is bent in a cross-section in one direction perpendicular to a principal surface and a cross-section in the other direction perpendicular to the one direction. However, the transduction film 10 is not limited thereto, and a configuration in which the transduction film 10 is held to be bent in at least a cross-section in one direction perpendicular to the principal surface of the transduction film 10 may be employed.

An O-ring or the like may be interposed between the case 42 and the transduction film 10. With this configuration, a damper effect is able to be achieved, and it is possible to prevent the vibration of the transduction film 10 from being transmitted to the case 42, and to obtain excellent acoustic properties.

In addition, the electroacoustic transducer using the transduction film 10 may have a configuration without the case 42 that accommodates the viscoelastic supporter 46.

For example, the viscoelastic supporter is placed on a support plate having rigidity, the transduction films 10a and 10b are placed to cover the viscoelastic supporter, and the same pressing member as described above is placed on the peripheral portion thereof. Next, a configuration in which the pressing member is fixed to the support plate by screws or the like to press the viscoelastic supporter together with the pressing member is also able to be used.

The size of the support plate may be greater than the viscoelastic supporter. Furthermore, by using various vibration plates formed of polystyrene, foamed PET, or carbon fiber as the material of the support plate, an effect of further amplifying the vibration of the electroacoustic transducer can be expected.

In addition, the electroacoustic transducer using the transduction film 10 may not have the viscoelastic supporter 46 and the case 42.

Figure 4A:
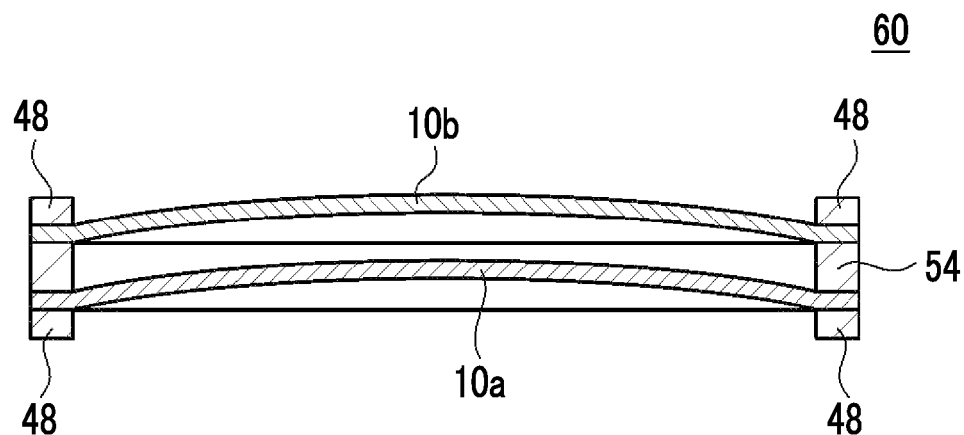
FIG. 4A is a sectional view schematically illustrating another example of the electroacoustic transducer of the present invention.

For example, as illustrated in FIG. 4A, a configuration in which the two transduction films 10a and 10b with convex portions formed therein are laminated with the spacer 54 interposed therebetween, and each of the transduction films 10a and 10b is fixed to the spacer 54 by the pressing member 48 may be employed.

In addition, the configuration in which the transduction film 10 is bent is not limited to a configuration in which the viscoelastic supporter is pressed and the convex portion is formed in the transduction film 10, and for example, may be a configuration in which the transduction film 10 is bonded to a resin film to be bent.

Alternatively, the transduction film 10 may be configured to be stretched over a bent frame. That is, in the electroacoustic transducer 60 as illustrated in FIG. 4A, a configuration in which the transduction film 10 is bent by using the spacer 54 and the pressing member 48 which are bent with a predetermined curvature.

Alternatively, a configuration in which an airtight case is used, the open end of the case is covered and closed by the transduction film, gas is introduced into the case to apply a pressure to the transduction film, and the transduction film is thus held in a convexly swollen state or in a concavely bent state may be provided.

In the examples illustrated in FIG. 1B and FIGS. 3A to 4A, the electroacoustic transducer is configured to include the two transduction films 10, but is not limited thereto, and may be configured to include three or more transduction films 10.

Figure 4B:
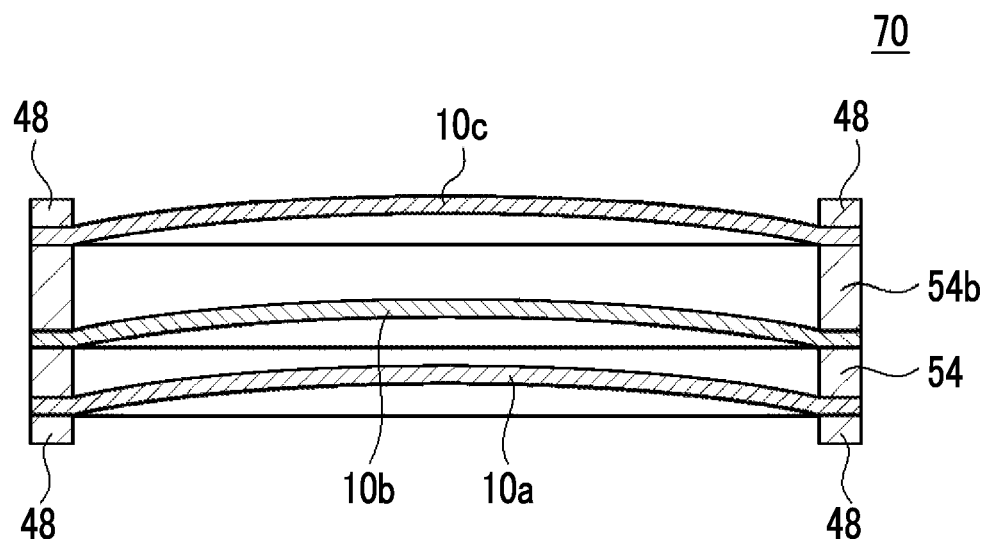
FIG. 4B is a sectional view schematically illustrating another example of the electroacoustic transducer of the present invention.

For example, as in an electroacoustic transducer 70 illustrated in FIG. 4B, a three-layer configuration in which three transduction films 10 having convex portions formed therein are used, the transduction films 10a and the transduction film 10b are laminated with the spacer 54 interposed therebetween, a transduction film 10c is further laminated on the surface of the transduction film 10b on the opposite side to the transduction film 10a with a spacer 54b interposed therebetween, and the laminate are interposed between and fixed by two pressing members 48 from the transduction film 10a side and the transduction film 10c side.

At this time, the distance of the gap between the transduction film 10a and the transduction film 10b and the distance of the gap between the transduction film 10b and the transduction film 10c may be the same or may be different from each other. In addition, in a case where the distance of the gap between at least one set of adjacent transduction films is less than or equal to 3 cm, the distance of the gap between the adjacent transduction films may be more than 3 cm.

As an example, in a case where the electroacoustic transducer 70 illustrated in FIG. 4B is configured such that the distance between the transduction film 10a and the transduction film 10b is more than or equal 3 cm and the distance between the transduction film 10b and the transduction film 10c is more than 3 cm, the electroacoustic transducer 70 can be used as a feedforward type noise cancelling device in which the transduction film 10c is used as a reference microphone, the transduction film 10b is used as a speaker, and the transduction film 10a is used as an error microphone.

Next, an example of a manufacturing method of the transduction film 10 will be described with reference to FIGS. 5A to 5E.

Figure 5A:
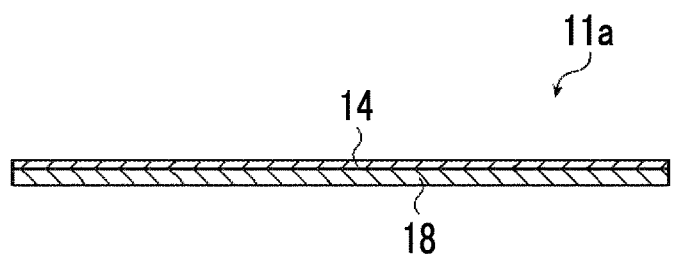
FIG. 5A is a conceptual view illustrating an example of a manufacturing method of the electroacoustic transduction film.

First, as illustrated in FIG. 5A, a sheet-like material 11a is prepared in which the lower electrode 14 is formed on the lower protective layer 18. The sheet-like material 11a may be prepared by forming a copper thin film or the like as the lower electrode 14 on the surface of the lower protective layer 18 using vacuum vapor deposition, sputtering, plating, and the like.

In a case where the lower protective layer 18 is extremely thin, and thus the handling ability is degraded, the lower protective layer 18 with a separator (temporary supporter)

may be used as necessary. As the separator, a PET film having a thickness of approximately 25 to 100 μm, and the like are able to be used. The separator may be removed after thermal compression bonding of the thin film electrode and the protective layer immediately before forming a side surface insulating layer, a second protective layer, and the like.

Alternatively, a commercially available product in which a copper thin film or the like is formed on the lower protective layer 18 may also be used as the sheet-like material 11a.

On the other hand, a coating material is prepared by dissolving a polymer material (hereinafter, also referred to as a viscoelastic material) having viscoelasticity at a normal temperature, such as cyanoethylated PVA, in an organic solvent, further adding the piezoelectric body particles 26 such as PZT particles thereto, and stirring and dispersing the resultant. The organic solvent is not particularly limited, and as the organic solvent, various organic solvents such as dimethylformamide (DMF), methyl ethyl ketone, and cyclohexanone are able to be used.

In a case where the sheet-like material 11a described above is prepared and the coating material is prepared, the coating material is cast (applied) onto the surface of the sheet-like material, and the organic solvent is evaporated and dried. Accordingly, as illustrated in FIG. 5B, a laminated body 11b in which the lower electrode 14 is provided on the lower protective layer 18 and the piezoelectric layer 12 is formed on the lower electrode 14 is prepared.

A casting method of the coating material is not particularly limited, and as the casting method, all known methods (coating devices) such as a slide coater or a doctor blade are able to be used.

Figure 5B:
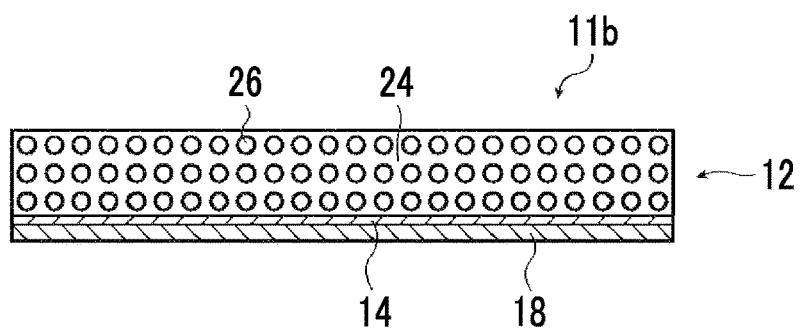
FIG. 5B is a conceptual view illustrating the example of the manufacturing method of the electroacoustic transduction film.

Alternatively, in a case where the viscoelastic material is a material that is able to be heated and melted like cyanoethylated PVA, a melted material is prepared by heating and melting the viscoelastic material and adding and dispersing an additive polymer material and the piezoelectric body particles 26 therein, is extruded into a sheet shape on the sheet-like material 11a illustrated in FIG. 5A by extrusion molding or the like, and is cooled, thereby preparing the laminated body 11b in which the lower electrode 14 is provided on the lower protective layer 18 and the piezoelectric layer 12 is formed on the lower electrode 14 as illustrated in FIG. 5B.

In addition, as described above, in the transduction film 10, in addition to the viscoelastic material such as cyanoethylated PVA, a polymer piezoelectric material such as PVDF may be added to the viscoelastic matrix 24.

In a case where the polymer piezoelectric material is added to the viscoelastic matrix 24, the polymer piezoelectric material added to the coating material may be dissolved. Alternatively, the polymer piezoelectric material to be added may be added to the heated and melted viscoelastic material and may be heated and melted.

In a case where the laminated body 11b in which the lower electrode 14 is provided on the lower protective layer 18 and the piezoelectric layer 12 is formed on the lower electrode 14, is prepared, it is preferable that the piezoelectric layer 12 is subjected to polarization processing (poling).

A polarization processing method of the piezoelectric layer 12 is not particularly limited, and as the polarization processing method, a known method is able to be used. As a preferred polarization processing method, a method illustrated in FIGS. 5C and 5D is exemplified.

Figure 5C:
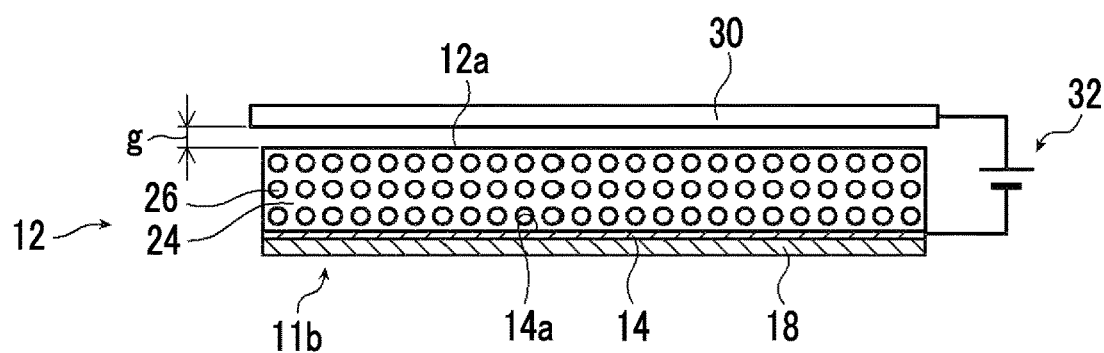
FIG. 5C is a conceptual view illustrating the example of the manufacturing method of the electroacoustic transduction film.
Figure 5D:
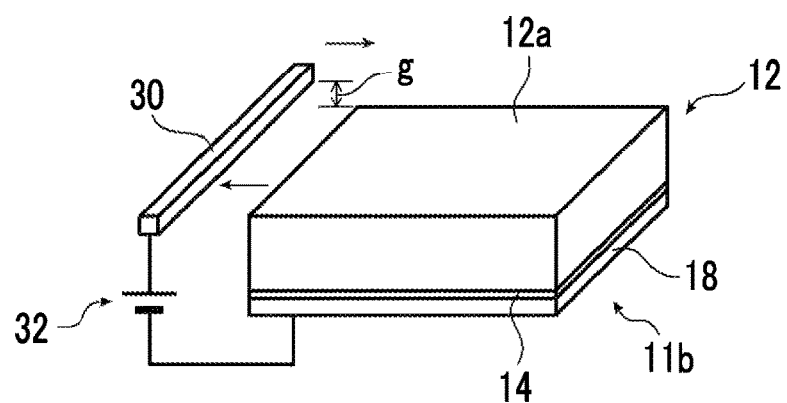
FIG. 5D is a conceptual view illustrating the example of the manufacturing method of the electroacoustic transduction film.

In this method, as illustrated in FIGS. 5C and 5D, for example, a gap g of 1 mm is opened on an upper surface 12a of the piezoelectric layer 12 of the laminated body 11b, and a rod-like or wire-like corona electrode 30 which is able to be moved along the upper surface 12a is disposed. Then, the corona electrode 30 and the lower electrode 14 are connected to a direct-current power source 32.

Furthermore, heating means for heating and holding the laminated body 11b, for example, a hot plate, is prepared.

Then, in a state where the piezoelectric layer 12 is heated and held by the heating means, for example, at a temperature of 100° C., a direct-current voltage of a few kV, for example, 6 kV, is applied between the lower electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the laminated body 11b is provided, and the polarization processing may be performed by moving the laminated body 11b. Moving means for a known sheet-like material may be used to move the laminated body 11b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper electrode 16 is formed before the polarization processing.

Before the polarization processing, calender processing may be performed to smoothen the surface of the piezoelectric layer 12 using a heating roller or the like. By performing the calender processing, a thermal compression bonding process described below is able to be smoothly performed.

In this way, while the piezoelectric layer 12 of the laminated body 11b is subjected to the polarization processing, a sheet-like material 11c is prepared in which the upper electrode 16 is formed on the upper protective layer 20. This sheet-like material 11c may be prepared by forming a copper thin film or the like as the upper electrode 16 on the surface of the upper protective layer 20 using vacuum vapor deposition, sputtering, plating, and the like.

Figure 5E:
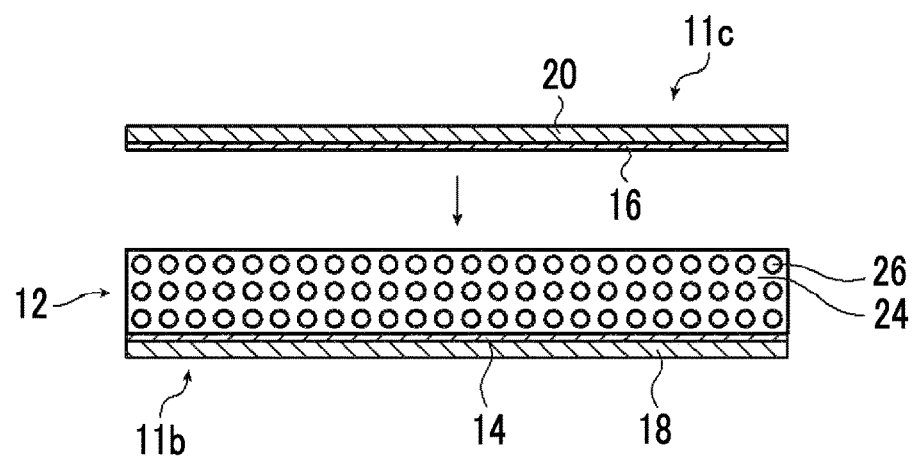
FIG. 5E is a conceptual view illustrating the example of the manufacturing method of the electroacoustic transduction film.

Next, as illustrated in FIG. 5E, the sheet-like material 11c is laminated on the laminated body 11b in which the piezoelectric layer 12 is subjected to the polarization processing while the upper electrode 16 faces the piezoelectric layer 12.

Furthermore, a laminated body of the laminated body 11b and the sheet-like material 11c is interposed between the upper protective layer 20 and the lower protective layer 18, and is subjected to the thermal compression bonding using a heating press device, a heating roller pair, or the like such that the transduction film 10 is prepared.

Manufacturing of the transduction film 10 may be performed using the sheet-like material in the form of a cut sheet, or may be performed by roll-to-roll (hereinafter, also referred to as RtoR).

As is well known, RtoR is a manufacturing method of unwinding, from a roll around which a long raw material is wound, the raw material, performing various treatments such as film formation and surface treatments while transporting the raw material in the longitudinal direction, and winding again the treated raw material into a roll shape.

The electroacoustic transducer of the present invention can be suitably used as a noise cancelling device. In addition, the electroacoustic transducer of the present invention can also be used as an electroacoustic transducer necessary for realizing a loudspeaking simultaneous call function in a communication device such as an intercom or a telephone.

Furthermore, a pillow type active noise control system can also be realized by assembling the electroacoustic transducer of the present invention into a pillow or a headrest, using the transduction film 10b as a microphone, using the transduction film 10a as a speaker, and connecting an electronic circuit, an amplifier, and the like to cause the speaker formed of the transduction film 10a to reproduce a sound with the inverted phase to a noise signal so as to cancel out the noise on the basis of the noise signal detected by the microphone formed of the transduction film 10b. In this case, there is no need to dispose an additional microphone between the ear and the speaker. Therefore, the degree of freedom of design is improved, and the path between the ear and the speaker is shortened, thereby achieving an improvement in muffling effect as well as miniaturization of the device.

Here, the electroacoustic transducer of the present invention is not limited to the use as the noise cancelling device as described above, and can also be used as a device for performing so-called "haptic feedback".

"Haptic feedback" is also called "haptics" and is a technique that imparts a tactile sensation to an operator by force, vibration, movement, or the like. For example, by vibrating in accordance with a touch operation of a touch panel, a tactile sensation that imparts an operating sensation to the finger of the operator who touches the touch panel is fed back.

As described above, since the electroacoustic transducer of the present invention uses, as the vibration plate, the transduction film obtained by interposing the polymer composite piezoelectric body in which the piezoelectric body particles are dispersed in the viscoelastic matrix formed of the polymer material having viscoelasticity at a normal temperature with the thin film electrodes, even in a configuration in which the two transduction films respectively used as the microphone and the speaker are laminated in close proximity to each other, the occurrence of howling between the microphone and the speaker can be suppressed.

In the electroacoustic transducer of the present invention, in a case where a pressing force is externally applied to the transduction film, howling easily occurs. Here, by utilizing the howling that easily occurs by the external pressing force, the electroacoustic transducer of the present invention can be used as a haptic feedback device that transmits vibration due to the howling to the operator while the operator presses the transduction film of the electroacoustic transducer.

Hereinafter, a case of using the electroacoustic transducer of the present invention as a haptic feedback device will be described in detail with reference to FIGS. 6 and 7.

Figure 6:
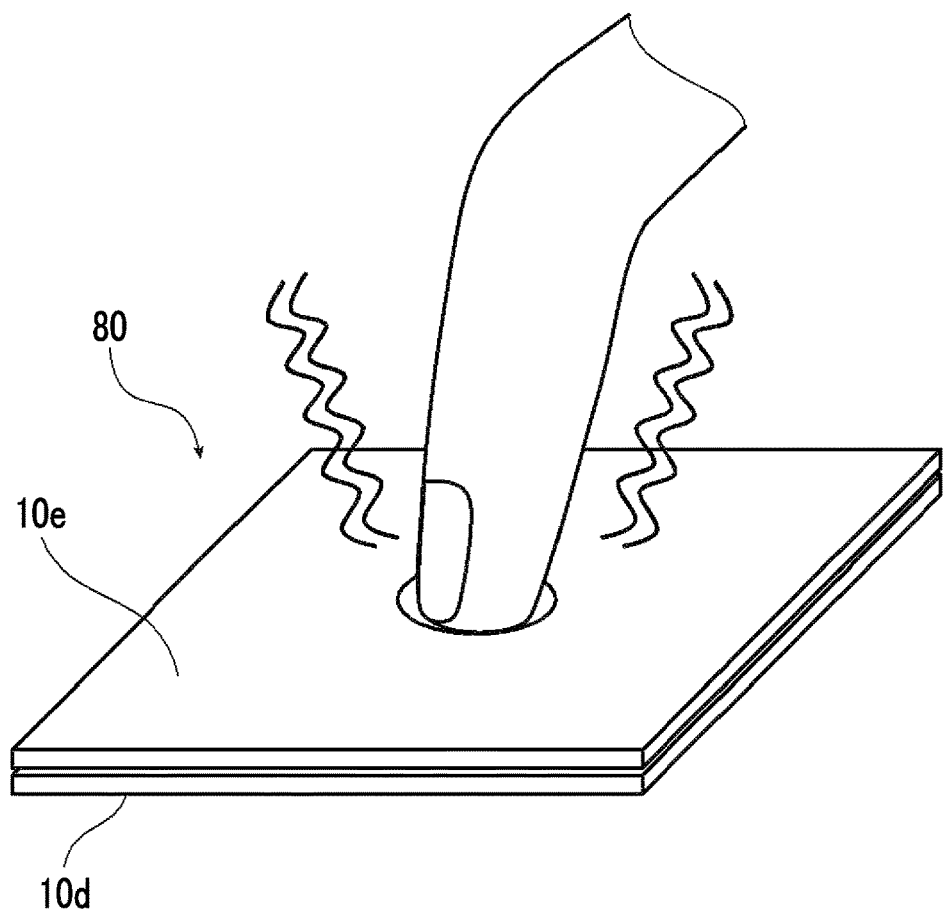
FIG. 6 is a perspective view schematically illustrating another example of the electroacoustic transducer of the present invention.
Figure 7:
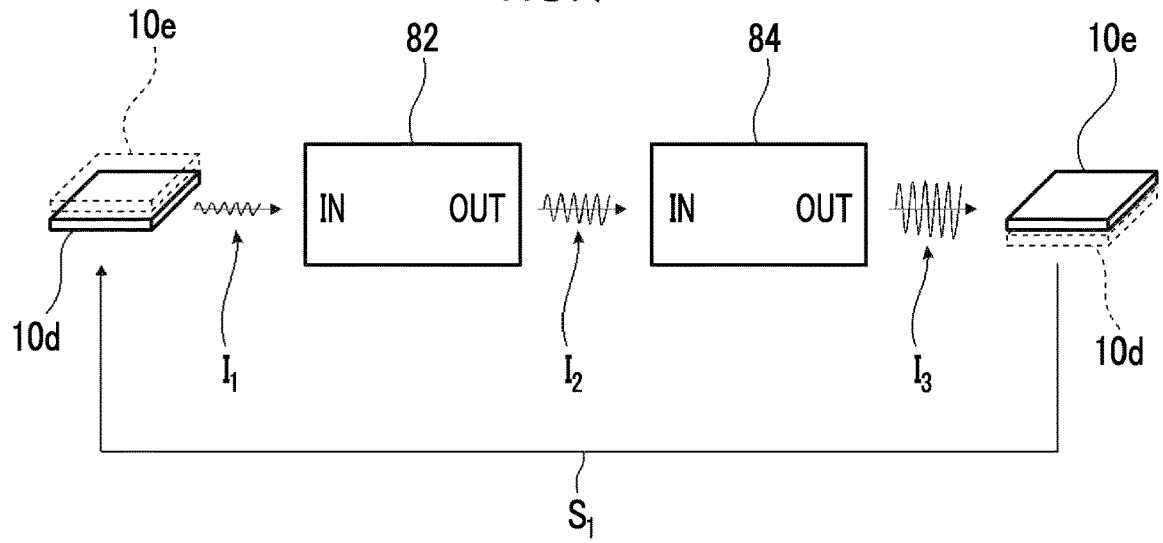
FIG. 7 is a conceptual view illustrating the flow of a signal of the electroacoustic transducer illustrated in FIG. 6.

FIG. 6 is a perspective view schematically illustrating an example of the electroacoustic transducer in a case of being used as a haptic feedback device, and FIG. 7 is a conceptual view for explaining a signal flow of the electroacoustic transducer of FIG. 6.

In FIG. 6, members other than the transduction film (the case, the viscoelastic support, and the like) are not illustrated for description.

An electroacoustic transducer 80 illustrated in FIG. 6 includes a transduction film 10d functioning as a microphone (hereinafter, also referred to as "microphone 10d") and a transduction film 10e functioning as a speaker (hereinafter, also referred to as "speaker 10e").

Furthermore, the electroacoustic transducer 80 includes a first amplifier 82 which is an amplifier for a microphone connected to the microphone 10d, and a second amplifier 84 which is an amplifier for a speaker connected to the speaker 10e.

As illustrated in FIG. 7, the microphone 10d, the first amplifier 82, the second amplifier 84, and the speaker 10e are connected in series in this order.

Specifically, the microphone 10d is connected to the first amplifier 82, which is the amplifier for the microphone, converts detected sound into an electrical signal $I_1$, and outputs the electrical signal $I_1$ to the first amplifier 82. The first amplifier 82 amplifies the electrical signal $I_1$ supplied from the microphone 10d and outputs an amplified electrical signal $I_2$ to the second amplifier 84 which is the amplifier for the speaker. The second amplifier 84 amplifies the electrical signal $I_2$ supplied from the first amplifier 82 and supplies an amplified electrical signal $I_3$ to the speaker 10e. The speaker 10e vibrates based on the supplied electrical signal $I_3$.

Here, in a normal environment, minute low frequency noise at as low as 400 Hz always sounds. Therefore, the microphone 10d of the electroacoustic transducer 80 constantly picks up the low frequency noise. However, in a normal state in which no pressing force is externally applied to the transduction film, the output electrical signal $I_1$ is very small, and the speaker 10e does not vibrate or only vibrates to an extent that cannot be recognized. Therefore, the microphone 10d does not pick up the vibration (sound) $S_1$ of the speaker 10e, and howling does not occur.

On the other hand, as illustrated in FIG. 6, in a case where a pressing force is externally applied to the microphone 10d and the speaker 10e which are laminated (that is, the two transduction films), due to the effects of ease of transmission of vibration between the microphone 10d and the speaker 10e, an increase in the transduction efficiency of each of the microphone 10d and the speaker 10e due to the bent pressed portions, and a close distance between the two transduction films in a case of a configuration in which the two transduction films are separately disposed, and the like, vibration $S_1$ based on the low frequency noise detected by the microphone 10d and reproduced by the speaker 10e is transmitted to the microphone 10d, resulting in the occurrence of howling. This howling causes the vibration of the speaker 10e to be amplified, and thus vibration occurs to an extent that the operator can recognize. Accordingly, it is possible to perform tactile feedback for transmitting vibration to the operator while the operator is pressing the transduction film.

In the related art, as a haptic feedback device, for example, in a case of a touch panel display, a device is known in which a touch panel that emits a signal according to a touch operation position is disposed on an image displayable flat panel display, and an actuator that operates by receiving the signal from the touch panel vibrates a glass substrate or the like of the touch panel to feed back a tactile sensation that impart an operating sensation to the operator.

In a case of such a device, a driver and complex signal processing are needed, and it is difficult to achieve a flexible device.

Contrary to this, in a case where the electroacoustic transducer of the present invention is used as a haptic feedback device, a driver and complex signal processing are not necessary, and it is possible to achieve a flexible device.

Furthermore, in the electroacoustic transducer of the present invention, in a case where no pressing force is applied to the transduction film, howling is less likely to occur, so that vibration is easily controlled by setting the magnification of the first amplifier and the second amplifier, and the like.

In order for human fingers to sense vibrations, an amplitude of about 5 μm or more is necessary. Therefore, it is preferable that the amplitude of the vibration of the transduction film amplified by the howling 5 μm or more while the operator presses the transduction film.

As the first amplifier 82, an amplifier for a microphone which is known in the related art can be appropriately used. As the second amplifier 84, an amplifier for a speaker which is known in the related art can be appropriately used.

In addition, the amplification factor of each of the first amplifier 82 and the second amplifier 84 depends on the specification of the transduction film, the distance between the two transduction films, and the like, and may be appropriately set such that in a case where no pressing force is applied to the transduction film, the amplitude of the vibration of the transduction film becomes less than 5 μm, and in a case where a pressing force is applied to the transduction film, the amplitude of the vibration of the transduction film becomes 5 μm or more.

Also, the positions of the microphone 10d and the speaker 10e are also not limited, and a configuration in which the microphone 10d is disposed on the front surface side or a configuration in which the speaker 10e is disposed on the front surface side may be employed. That is, a configuration in which a pressing force is applied from the microphone 10d side, or a configuration in which a pressing force is applied from the speaker 10e side may be employed.

In addition, the microphone 10d and the speaker 10e may be laminated in contact with each other, or may be laminated with an interval therebetween. The distance between the microphone 10d and the speaker 10e in a case of disposing the microphone 10d and the speaker 10e with an interval therebetween is not limited as long as the distance is less than or equal to 3 cm, and may be appropriately set such that in a case where no pressing force is applied to the transduction film, the amplitude of the vibration of the transduction film is less than 5 μm and in a case where a pressing force is applied to the transduction film, the amplitude of the vibration of the transduction film is more than or equal 5 μm.

In addition, in the case where the microphone 10d and the speaker 10e are disposed to be separated from each other, the microphone 10d and the speaker 10e may come into contact with each other or may remain separated from each other in a case where a pressing force is applied to the transduction film.

As described above, the electroacoustic transducer of the present invention is described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 5A to 5E described above, the transduction film 10 illustrated in FIG. 2 was prepared.

First, cyanoethylated PVA (CR-V manufactured by Shin-Etsu Chemical Co., Ltd.) was dissolved in methyl ethyl ketone (MEK) at the following compositional ratio. Thereafter, PZT particles were added to this solution at the following compositional ratio, and were dispersed by using a propeller mixer (rotation speed 2000 rpm), and thus a coating material for forming the piezoelectric layer 12 was prepared.

PZT Particles 1000 parts by mass
Cyanoethylated PVA 100 parts by mass
MEK 600 parts by mass In addition, the PZT particles were obtained by sintering commercially available PZT raw material powder at 1000° C. to 1200° C. and thereafter crushing and classifying the resultant so as to have an average particle diameter of 3.5 μm.

The sheet-like materials 11a and 11c in each of which a copper thin film having a thickness of 0.1 μm was vacuum vapor deposited on a PET film having a thickness of 4 μm were prepared. That is, in this example, the upper electrode 16 and the lower electrode 14 are copper vapor deposition thin films having a thickness of 0.1 μM, and the upper protective layer 20 and the lower protective layer 18 are PET films having a thickness of 4 μm.

In order to obtain good handleability during the process, as the PET film, a film with a separator (temporary supporter PET) having a thickness of 50 μm attached thereto was used, and the separator of each protective layer was removed after the thermal compression bonding of the thin film electrodes and the protective layers.

The coating material for forming the piezoelectric layer 12 prepared as described above was applied onto the lower electrode 14 (the copper vapor deposition thin film) of the sheet-like material 11a by using a slide coater. Furthermore, the coating material was applied such that the film thickness of the coating film after being dried was 20 μm.

Next, a material in which the coating material was applied onto the sheet-like material 11a was heated and dried in an oven at 120° C. such that MEK was evaporated. Accordingly, the laminated body 11b was prepared in which the lower electrode 14 made of copper was provided on the lower protective layer 18 made of PET and the piezoelectric layer 12 (piezoelectric layer) having a thickness of 20 μm was formed thereon.

The piezoelectric layer 12 of the laminated body 11b was subjected to the polarization processing by corona poling illustrated in FIGS. 5C and 5D. Furthermore, the polarization processing was performed by setting the temperature of the piezoelectric layer 12 to 100° C., and applying a direct-current voltage of 6 kV between the lower electrode 14 and the corona electrode 30 so as to cause corona discharge to occur.

The sheet-like material 11c was laminated on the laminated body 11b which was subjected to the polarization processing while the application surface of the applied film in which a mixture of cyanoethylated pullulan and cyanoethylated PVA (CR-M manufactured by Shin-Etsu Chemical Co., Ltd.) was applied onto the upper electrode 16 (copper thin film side) so as to have a thickness of 0.3 μm, faced the piezoelectric layer 12.

Next, the laminated body of the laminated body 11b and the sheet-like material 11c was subjected to thermal compression bonding at 120° C. by using a laminator device, and thus the piezoelectric layer 12 adhered to the upper electrode 16 and the lower electrode 14 such that the transduction film 10 was prepared.

The electroacoustic transducer 60 as illustrated in FIG. 4A was prepared by using the prepared transduction film 10.

First, convex portions having a diameter of 90 mm and a height of 9 mm were formed in the transduction film 10 by a heat compression molding method using a heat press machine (AH-2003 manufactured by AS ONE Corporation).

As the pressing member 48, a circular plate member made of aluminum, which had an opening 48a with a diameter of 90 mm was used.

As the spacer 54, a circular plate member made of aluminum, which had an opening 48a with a diameter of 90 mm and had a thickness of 3 mm was used.

Using the two transduction films 10a and 10b having the convex portions formed therein, the transduction films 10a and 10b were respectively disposed on both surfaces of the spacer 54, the end edge portions thereof were fixed by the pressing member 48, thereby preparing the electroacoustic transducer 60.

The gap between the transduction film 10a and the transduction film 10b was 3 mm.

[Evaluation]

The prepared electroacoustic transducer was used as a noise cancelling device and the noise reduction effect was evaluated.

A measurement microphone was disposed immediately above the center of the transduction film 10 of the prepared electroacoustic transducer (in a direction perpendicular to the principal surface of the transduction film 10) at a position 2 cm apart, and a noise source (commercially available dynamic speaker) was disposed at a position 50 cm apart in a surface direction of the transduction film.

Figure 8A:
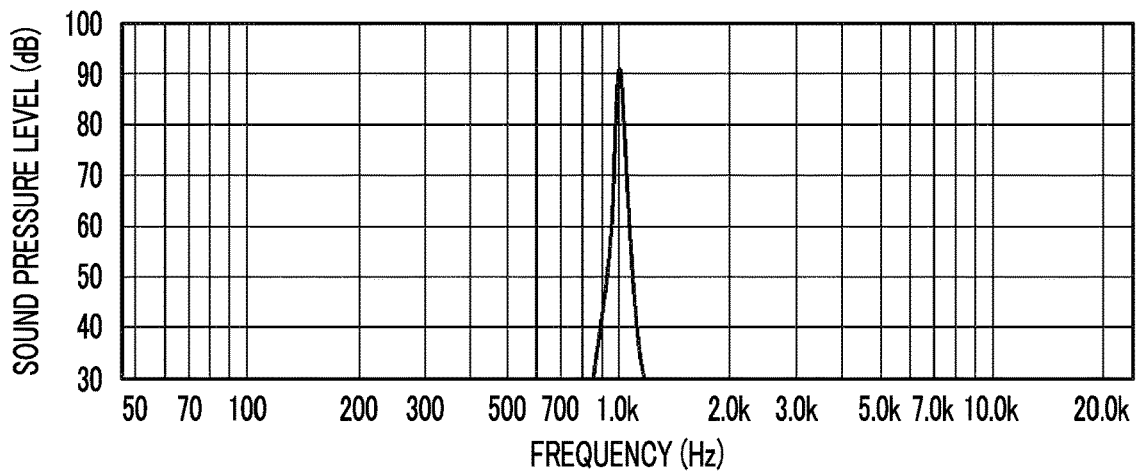
FIG. 8A is a graph showing the relationship between a frequency and a sound pressure level.

First, without operating the electroacoustic transducer, noise of 90 dB at 1 kHz was generated from the noise source, the sound generated from the noise source was measured by the measurement microphone, and the relationship between a frequency and a sound pressure level was obtained. The graph is shown in FIG. 8A. In the graph shown in FIG. 8A, the vertical axis represents the sound pressure level (dB) and the horizontal axis represents the frequency (Hz).

Next, in the electroacoustic transducer, an electronic circuit, an amplifier, and the like were connected so that the transduction film 10b was used as the microphone and the transduction film 10a was used as the speaker for reproducing a sound with the inverted phase so as to cancel out the noise on the basis of a noise signal detected by the microphone.

Figure 8B:
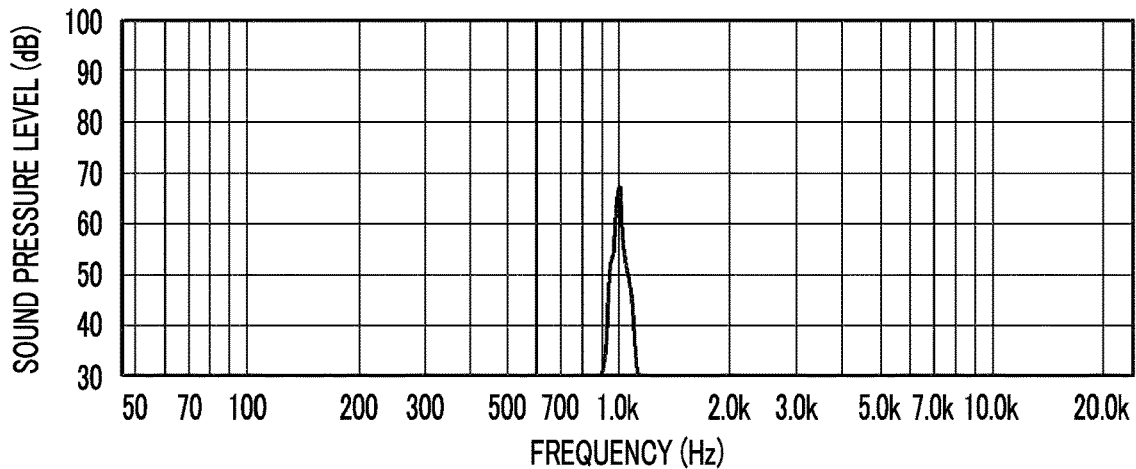
FIG. 8B is a graph showing the relationship between a frequency and a sound pressure level.

In a state in which the electroacoustic transducer was operated, noise of 90 dB at 1 kHz was generated from the noise source, the sound input to the measurement microphone was measured, and the relationship between a frequency and a sound pressure level was obtained. The graph is shown in FIG. 8B. In the graph shown in FIG. 8B, the vertical axis represents the sound pressure level (dB) and the horizontal axis represents the frequency (Hz).

In comparison between FIGS. 8A and 8B, in Example 1 in which the electroacoustic transducer of the present invention was used as the noise cancelling device, noise of 90 dB was reduced to about 66 dB.

From these results, it can be seen that the electroacoustic transducer of the present invention suppresses the occurrence of howling by employing the configuration in which the transduction film 10a functioning as the microphone and the transduction film 10b functioning as the speaker are laminated with a gap of 3 cm or less therebetween, and thus can suitably reduce noise.

From the above results, the effect of the present invention is obvious.

EXPLANATION OF REFERENCES

10, 10a, 10b, 10c, 10d, 10e: electroacoustic transduction film
11a, 11c: sheet-like material
11b: laminated body
12: piezoelectric layer
14: lower thin film electrode
16: upper thin film electrode
18: lower protective layer
20: upper protective layer
24: viscoelastic matrix
26: piezoelectric body particles
30: corona electrode
32: direct-current power source
40, 50, 52, 60, 70: electroacoustic transducer
42: case
46: viscoelastic supporter
48: pressing member
54, 62, 72: spacer
64: bolt
66: nut
80: electroacoustic transducer
82: first amplifier
84: second amplifier

What is claimed is:

1. An electroacoustic transducer comprising:
an electroacoustic transduction film including a polymer composite piezoelectric body in which piezoelectric body particles are dispersed in a viscoelastic matrix formed of a polymer material having viscoelasticity at a normal temperature, and thin film electrodes respectively laminated on both surfaces of the polymer composite piezoelectric body,
wherein two or more of the electroacoustic transduction films are laminated,
principal surfaces of the electroacoustic transduction films adjacent to each other are in contact with each other, and
the electroacoustic transduction films adjacent to each other and not adhered to each other are capable of vibrating independently of each other.

2. The electroacoustic transducer according to claim 1, wherein the electroacoustic transduction film is held such that at least a portion of the electroacoustic transduction film is bent so as to protrude toward one principal surface side.

3. The electroacoustic transducer according to claim 2, wherein the electroacoustic transduction film is held such that at least a portion of the electroacoustic transduction film is bent in a cross-section in one direction perpendicular to a principal surface and a cross-section in the other direction perpendicular to the one direction.

4. The electroacoustic transducer according to claim 2, wherein at least one of the electroacoustic transduction films is bent and supported by an elastic supporter.

5. The electroacoustic transducer according to claim 3, wherein at least one of the electroacoustic transduction films is bent and supported by an elastic supporter.

6. The electroacoustic transducer according to claim 4, wherein the elastic supporter has viscoelasticity.

7. The electroacoustic transducer according to claim 5, wherein the elastic supporter has viscoelasticity.

8. The electroacoustic transducer according to claim 1, wherein at least one of the electroacoustic transduction films functions as a microphone, and at least another of the electroacoustic transduction films functions as a speaker.

9. The electroacoustic transducer according to claim 7, wherein at least one of the electroacoustic transduction films functions as a microphone, and at least another of the electroacoustic transduction films functions as a speaker.

10. The electroacoustic transducer according to claim 1, wherein at least one of the electroacoustic transduction films functions as a microphone which detects ambient noise, and at least another of the electroacoustic transduction films functions as a speaker which reproduces a noise cancellation signal generated on the basis of a noise signal detected by the microphone.

11. The electroacoustic transducer according to claim 9, wherein at least one of the electroacoustic transduction films functions as a microphone which detects ambient noise, and at least another of the electroacoustic transduction films functions as a speaker which reproduces a noise cancellation signal generated on the basis of a noise signal detected by the microphone.

12. The electroacoustic transducer according to claim 1, wherein at least one of the electroacoustic transduction films functions as a microphone which detects ambient noise, and at least another of the electroacoustic transduction films functions as a speaker which amplifies and reproduces a noise signal detected by the microphone.

13. The electroacoustic transducer according to claim 9, wherein at least one of the electroacoustic transduction films functions as a microphone which detects ambient noise, and at least another of the electroacoustic transduction films functions as a speaker which amplifies and reproduces a noise signal detected by the microphone.

14. The electroacoustic transducer according to claim 12, wherein, in a case where a pressing force is applied from the outside to one principal surface side of the two or more electroacoustic transduction films laminated, howling occurs between the microphone and the speaker to amplify vibration of the speaker.

15. The electroacoustic transducer according to claim 13, wherein, in a case where a pressing force is applied from the outside to one principal surface side of the two or more electroacoustic transduction films laminated, howling occurs between the microphone and the speaker to amplify vibration of the speaker.

16. The electroacoustic transducer according to claim 12, wherein the ambient noise is low frequency noise at 400 Hz or less.

17. The electroacoustic transducer according to claim 15, wherein the ambient noise is low frequency noise at 400 Hz or less.

* * * * *